United States Patent [19]

Ohashi et al.

[11] Patent Number: 5,504,924

[45] Date of Patent: Apr. 2, 1996

[54] COOLING SYSTEM OF ELECTRONIC COMPUTER USING FLEXIBLE MEMBERS IN CONTACT WITH SEMICONDUCTOR DEVICES ON BOARDS

[75] Inventors: Shingeo Ohashi, Tsuchiura; Tadakatsu Nakajima; Heikichi Kuwahara, both of Ibaraki; Toshio Hatada, Tsuchiura; Hitoshi Matsushima, Ryugasaki; Motohiro Sato; Hiroshi Inouye, both of Ibaraki; Takao Ohba; Akira Yamagiwa, both of Hadano, all of Japan

[73] Assignee: Hitachi, Ltd., Tokyo, Japan

[21] Appl. No.: 317,621

[22] Filed: Sep. 26, 1994

Related U.S. Application Data

[63] Continuation of Ser. No. 797,955, Nov. 26, 1991, abandoned.

[30] Foreign Application Priority Data

Nov. 28, 1990 [JP] Japan ................................ 2-322823

[51] Int. Cl.$^6$ ....................................................... G06F 9/00
[52] U.S. Cl. ..................... 375/800; 364/DIG. 1; 364/267; 364/267.6
[58] Field of Search ..................................... 395/575, 800, 395/550; 361/382–385; 165/185; 357/81, 82, 87; 62/99, 178, 201

[56] References Cited

U.S. PATENT DOCUMENTS

| | | | |
|---|---|---|---|
| 4,489,363 | 12/1984 | Goldberg | 361/383 |
| 4,498,530 | 2/1985 | Lipschutz | 165/185 |
| 4,513,351 | 4/1985 | Davis et al. | 361/384 |
| 4,546,619 | 10/1985 | Rohner | 62/419 |

(List continued on next page.)

FOREIGN PATENT DOCUMENTS 503641  5/1977  Australia .
62-252197  of 0000  Japan .
62-26899  of 0000  Japan .

OTHER PUBLICATIONS

Research Disclosure No. 28905, No. 289, May 1988, Havant GB, p. 263 "Cooling Packet for Electronic Components".
Fujitsu–Scientific and Technical Journal vol. 15, No. 3, 1979–Kawasaki JP pp. 47–62, Yamamoto et al "Limitation on Forced Air Cooling in High Speed Computers".
IBM Technical Disclosure Bulletin vol. 32, No. 5A, Oct. 1989, New York, U.S. p. 222 "Regulation of Humidity in Memory Devices".
Patent Abstracts of Japan—vol. 014, No. 083 16 Feb. 1990, & JP-A-12 96 061 (Mitsubishi Electric Corp. 29 Nov. 1989).
IBM Technical Disclosure Bulletin—vol. 33, No. 1A, Jun. 1990, New York, U.S. pp. 254–255, "Low Temperature Computer Package with Multiple Thermal Zones".
Research Disclosure No. 30986, No. 309, Jan. 1990, Havant GB p. 55 "Thermal Control Scheme for Boiling Cooling of Chips with Attached Extended Surfaces".
Patent Abstracts of Japan vol. 014, No. 476, (E–991) 17 Oct. 1990 & JP-A-21 96 454 (Hitachi, Ltd.) 3 Aug. 1990.
IBM Technical Disclosure Bulletin—vol. 8, No. 11, Apr. 1966, New York, U.S., p. 1692, Chu R. C. "Counter–Flow Cooling System".

*Primary Examiner*—Mehmet Geckil
*Attorney, Agent, or Firm*—Antonelli, Terry, Stout & Kraus

[57] ABSTRACT

An electronic computer cooling system having a cooling apparatus to cool an electronic computer and cooling members for thermally connecting semiconductor devices whose operating speeds are raised by cooling to a low temperature source of the cooling apparatus. Circuit boards onto which the semiconductor devices and the like constructing the electronic computer are mounted and the cooling apparatus such as a refrigerating apparatus and the like are compactly enclosed in a single casing. Or, the circuit boards and the cooling apparatus are compactly enclosed in separate detachable casings, respectively. Thus, a structure in which desired semiconductor devices can be certainly cooled by using the cooling members is obtained.

18 Claims, 7 Drawing Sheets

U.S. PATENT DOCUMENTS

| | | | |
|---|---|---|---|
| 4,674,004 | 6/1987 | Smith et al. | 361/384 |
| 4,729,424 | 3/1988 | Mizuno et al. | 165/30 |
| 4,740,866 | 4/1988 | Kajiwara et al. | 361/382 |
| 4,750,086 | 6/1988 | Mittal | 361/382 |
| 4,770,242 | 9/1988 | Daikoku et al. | 165/185 |
| 4,783,721 | 11/1988 | Yamamoto et al. | 361/382 |
| 4,812,733 | 3/1989 | Tobey | 357/87 |
| 4,851,965 | 7/1989 | Gabuzda et al. | 361/383 |
| 4,901,201 | 2/1990 | Crowe | 361/384 |
| 4,908,695 | 3/1990 | Morihara et al. | 357/81 |
| 4,935,864 | 6/1990 | Schmidt et al. | 363/141 |
| 4,996,589 | 2/1991 | Kajiwara et al. | 357/82 |
| 5,058,389 | 10/1991 | Yasuda et al. | 62/99 |
| 5,063,476 | 11/1991 | Hamadah et al. | 361/384 |
| 5,092,130 | 3/1992 | Nagao et al. | 62/6 |
| 5,133,403 | 7/1992 | Yokono et al. | 165/185 |
| 5,285,347 | 2/1994 | Fox et al. | 361/385 |

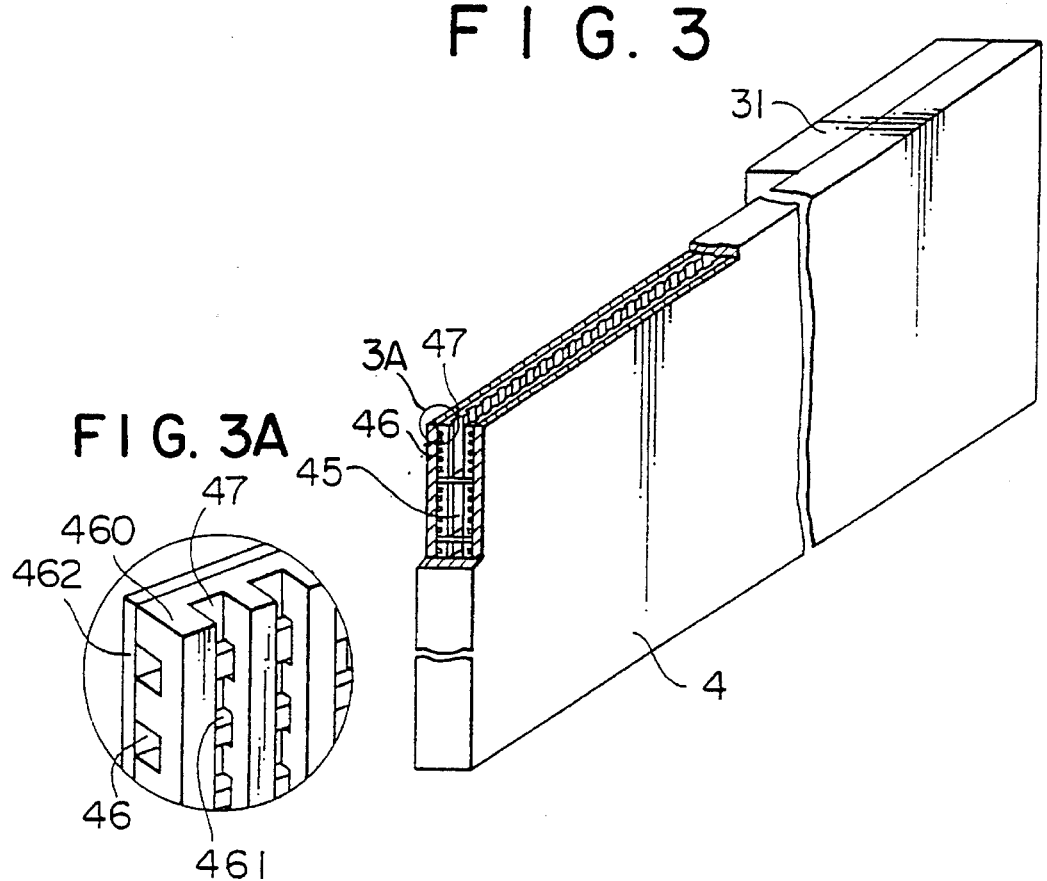
FIG. 3
FIG. 3A
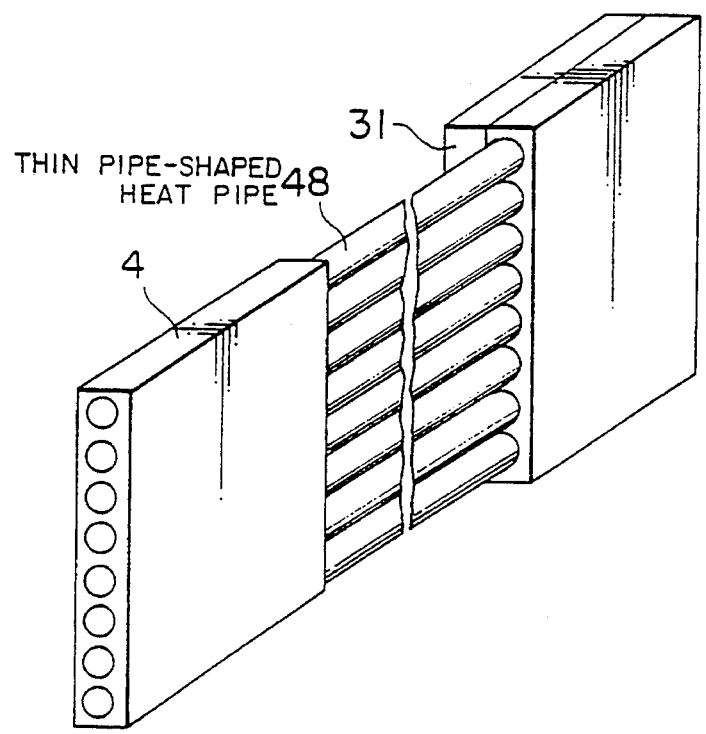
FIG. 4

FIG. 13A
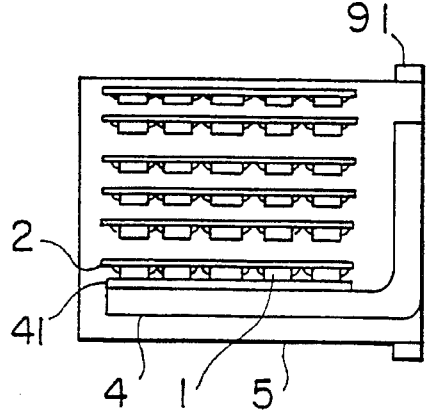
FIG. 13B
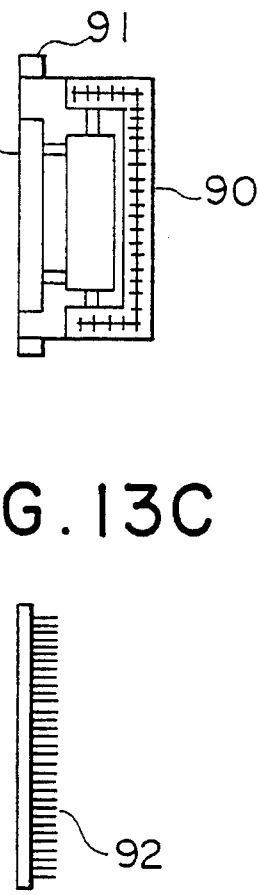
FIG. 13C
FIG. 14
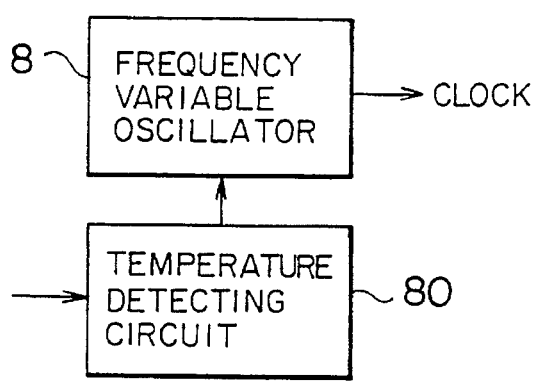

COOLING SYSTEM OF ELECTRONIC COMPUTER USING FLEXIBLE MEMBERS IN CONTACT WITH SEMICONDUCTOR DEVICES ON BOARDS

This application is a continuation of Ser. No. 07/797,955, filed Nov. 26, 1991, now abandoned.

BACKGROUND OF THE INVENTION

The invention relates to a cooling system of an electronic computer and, more particularly, to an electronic computer in which an operating speed of a semiconductor device is raised to thereby improve an operating speed of a computer system and also relates to a cooling system of such an electronic computer.

A conventional electronic apparatus has a construction in which one or more fans are provided to cool a number of heat generating sources such as package, disk, power source, and the like which exist in a casing. A cooling air is blown by the fans and enters the casing through holes and flows in the casing along the package, disk, and power source and flows to the outside of the casing by the fans. In such a construction, an inflow temperature of the cooling air is equal to a room temperature. There is a case where, for example, a temperature of the main portion of the package rises to about 50° to 100° C. even when it is sufficiently cooled. As a method of improving the cooling of the package as mentioned above, there is an example in which channels are formed by surrounding the package by partition plates and fans are arranged before and after the channel as disclosed in JP-B-60-11830 (JP-A-53-145054). The publication also shows an example of coupling via heat pipe a cooling air inlet side with a heat source of very large heat capacity among various heat sources.

In "IEEE Transaction on Electron Devices", Vol. 36, No. 8 (1989), page 1404, a cooling system in which a board on which CMOS devices are mounted is dipped in liquid nitrogen is disclosed. As disclosed in JP-A-1-270296, there is a cooling system in which an inflow air is previously cooled by a refrigerating cycle.

Among the above conventional techniques, in the case of the cooling system by the fans disclosed in JP-B-60-11830, to increase the cooling capacity in order to further reduce the temperature of semiconductor device, a flow rate of the air must be increased by increasing the number of fans, by increasing the size of fans, or the like. In such a case, there is a problem of an increase in fan noises. On the other hand, there is also a problem such that when the size of radiating fans is increased in order to enhance the cooling capability, a high installing density is not obtained. Further, the temperature of semiconductor device cannot be held to a temperature less than the external air temperature and no consideration is given to the realization of a high operating speed of the device due to the realization of a low temperature.

On the other hand, according to the example in which the board on which the semiconductor device is mounted is dipped into liquid nitrogen, there are problems such that the size of refrigerator is large and another casing different from the casing enclosing the semiconductor device is needed, so that a large occupied area is necessary. According to the system disclosed in JP-A-1-270296, since all of the devices are uniformly cooled, no consideration is given to the realization of a high operating speed of a special device and the dehumidification.

SUMMARY OF THE INVENTION

It is the first object of the invention to improve an operating speed of an electronic computer by cooling special devices such as CMOS devices or the like so that the computing speed is raised by cooling the devices.

The second object of the invention is to provide an electronic computer of a high operating speed having a cooling system of a high reliability.

The third object of the invention is to provide an electronic computer which has a cooling system which prevents a formation of moisture or dew on the semiconductor devices so as to improve the reliability of the computer.

The fourth object of the invention is to provide an electronic computer which can calculate at the operating speed corresponding to the operating speed of a special device such as a CMOS device or the like from a time point of the activation of the computer.

To accomplish the first object, according to one aspect of the invention, a flexible cooling member having a high heat conductivity is arranged between a special semiconductor device by which the overall operating speed of the computer is restricted and an evaporator of a refrigerator or a first cooling member which is thermally in contact with the evaporator, and such a semiconductor device is locally cooled by a cooling source which is generated from the refrigerator.

A channel to lead the air cooled by the evaporator of the refrigerator is provided and the cooled air is blown out from holes formed in the channel and is allowed to collide with such a special semiconductor device, thereby cooling the device.

A special semiconductor device and a cooling member having therein a group of liquid channels are thermally connected by a flexible member having a high heat conductivity. A liquid is circulated between the group of channels in the cooling member and a heat radiator provided on the outer wall of the casing by liquid pumps, thereby radiating the heat generated from the semiconductor device into the air on the outside of the casing.

To accomplish the second object, according to the invention, a cooling member thermally connects a special semiconductor device and an evaporator of a refrigerator is constructed by a plurality of heat pipes, with the airtightness of each heat pipe being independently maintained.

To accomplish the third object, according to a further aspect of the invention, a refrigerator is constructed by refrigerating cycles of two or more stages and a dehumidifier is provided for an evaporator on the low temperature side.

A water adsorption resin is attached to the evaporating portion in which a temperature decreases.

To accomplish the fourth object, according to the invention, a temperature of a special semiconductor device is detected and a frequency of a reference clock generating section of the operation of the computer can be varied in accordance with the temperature value.

According to a specific aspect of the present invention, there is provided an electronic computer and cooling system including a refrigerator contained with the computer in a casing, the refrigerator comprising an evaporator, a compressor, expansion valves, condensers, and the like, with the computer including boards on which a plurality of semiconductor devices, wherein the semiconductor devices and the evaporator of the refrigerator are thermally connected by first and second cooling members. The first cooling member is formed by a block made of a material of a high heat conductivity or a group of a plurality of independent heat pipes, with one end of the first cooling member being connected to the evaporator and the other end being arranged so as to face the board on which the semiconductor devices are mounted through the flexible second cooling member having a high heat conductivity. The heat which are generated from the respective semiconductor devices is transported to the evaporator through the second and first cooling members. The heat exchange with an operating refrigerant of the refrigerating cycle is performed by the evaporator, with the heat being the radiated to the outside of the casing by the condensers, whereby a heat path from the semiconductor devices to the evaporator of the refrigerator is assured, and a high cooling performance is obtained by a low temperature source by the refrigerator and the high speed operation of the computer can be accomplished.

The electronic computer is constructed by a number of semiconductor devices whose functions and operating speeds are different and the operating speed of the entire computer is restricted by a device of the slow operating speed.

First, a cooling source is generated by the refrigerator, and the evaporator of the refrigerator or the first cooling member which is thermally contacts the evaporator and the special semiconductor device are thermally connected by arranging the flexible cooling member having a high heat conductivity between them. Therefore, for example, when a special device such as a CMOS device or the like is set into a low temperature, the operating speed rises, so that the operating speed of the entire computer can be improved. In the above case, since the cooling member for connecting the semiconductor device and the evaporator of the refrigerator as a cooling source is constructed by a flexible material having a high heat conductivity, gaps existing between the device surfaces and the cooling member surface due to a variation in heights of the devices can be connected by a small contact heat resistance, with the heat of the respective semiconductor devices being sufficiently radiated so as to reduce the operating temperatures. On the other hand, since the temeprature of the cooling source is held to be low by the refrigerator, a large temperature difference between the cooling source and the semiconductor device can be obtained, and a high cooling performance can be derived.

A channel to lead the air cooled by the evaporator of the refrigerator is provided, with the cooled air being allowed to collide with the special semiconductor device from the hole formed in the channel, thereby cooling the device. Therefore, the semiconductor device can be directly cooled by the jet air stream blown from the hole and the effective cooling of a high heat conductivity can be executed. Consequently, the special semiconductor device can be sufficiently cooled and the operating speed can be increased.

The special semiconductor device and the cooling member having therein a group of liquid channels are thermally connected by the flexible member having a high heat conductivity. The liquid is circulated by the liquid pump between the group of channels in the cooling member and the radiator provided for the outer wall of the casing. Thus, the special device can be cooled and the high speed operation can be realized.

Since the liquid is used as a cooling medium and is circulated in the casing, the high cooling performance can be realized by the cooling system of a small size and low noises.

Second, the cooling member for thermally connecting the special semiconductor device and the evaporator of the refrigerator is constructed by a plurality of heat pipes and the airtightness of each heat pipe is independently held. Thus, the special semiconductor device can be cooled. Even when the airtightness of the heat pipe of a certain portion is not held, the heat transport can be executed by the remaining heat pipes and the cooling can be performed at a high reliability.

Third, even when the semiconductor device is held to a low temperature, the dehumidifier is further provided for the cooling source of a low temperature, so that the moisture contained in the air in the casing is eliminated by the dehumidifier on the cooling source side. It is, therefore, possible to avoid a dew formation on the semiconductor device and prevent an electrical malfunctioning.

Fourth, the temperature of the semiconductor device is detected and the frequency of the reference clock can be varied in accordance with the temperature. Therefore, even in the case where the temperature of the cooling source is not immediately reduced by the refrigerator as in the case of the activation of the system, by reducing the clock frequency, the operating speed of the system is decreased. After the cooling source was reduced to a predetermined temperature and sufficient cooling performance was derived, the clock frequency is raised and the high speed operation is performed. Consequently, the normal operation can be executed even upon activation or starting of the system.

BRIEF DESCRIPTION OF THE DRAWINGS

FIGS. 1 to 4 are diagrams showing an embodiment of the invention;

FIG. 1 is a cross sectional perspective view of an electronic computer;

FIG. 2 is a partial enlarged perspective view of a cooling member;

FIGS. 3 and 4 are perspective views of a first cooling member;

FIG. 3A is an enlarged detail view of a portion designated 3A in FIG. 3;

FIGS. 13A are diagrams showing other embodiments of the invention, wherein FIG. 13A is a plan view showing the inside of an electronic computer, FIG. 13B is a cross sectional view of a refrigerator, FIG. 13C is a cross sectional view of a heat radiation fin;

FIG. 14 is a diagram showing a construction of a reference clock generating section.

DESCRIPTION OF THE PREFERRED EMBODIMENTS

Figure 1:
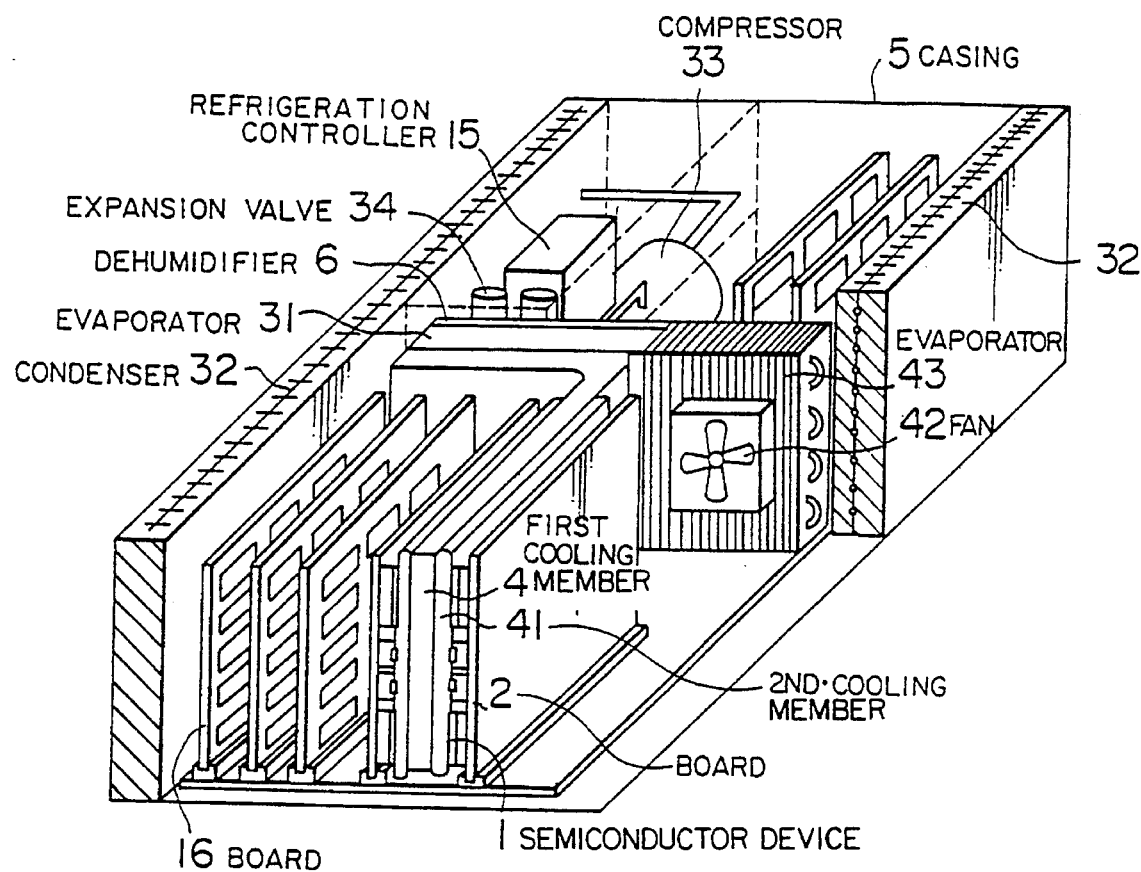

An embodiment of the invention will be described with reference to FIGS. 1 to 4, according to these figures, boards 2 and 16, having a plurality of semiconductor devices 1 mounted thereon, a refrigerator, and cooling members 4 and 41 are enclosed in one casing 5. A plurality of semiconductor device groups having different functions for command processes, calculation, memory, input and output, operation control, and the like are installed on the boards 2 and 16. The computer is constructed by a plurality of boards as necessary. On the other hand, the refrigerator is constructed by a refrigerating cycle comprising evaporators 31 and 43, a condenser 32, an expansion valve 34, a compressor 33, refrigeration controller 15 and the like. Freon or the like is used as an operating refrigerant.

The condenser 32 is constructed so as to form a part of or all of the portion of the casing 5 of the computer system. Although it is preferable to forcedly cool the condenser 32 by using a fan or the like, there is not always necessary to provide the fan when the condenser 32 has an enough large heat transfer area.

In the embodiment shown in FIG. 1, both sides of the casing 5 are formed by the condensers 32. The evaporator is constructed by two portions of the evaporators 31 and 43. One end side of the first cooling member 4 made of a heat pipe or a heat conductive material having a high heat conductivity such as copper, aluminum, or the like is in thermal contact with the portion of the evaporator 31. The other end side of the first cooling member 4, that is, on the board 2 side is in thermal contact with the semiconductor devices 1 through the second cooling member 41 which has a high heat conductivity and is formed by a flexible material. In the embodiment shown in FIG. 1, although the boards 2 are arranged on both sides of the second cooling member 41, they can be also properly arranged at arbitrary positions. A fan 42 is attached to the portion of the evaporator 43. The cooled air is circulated in the casing 5 by the fan 42. A dehumidifier 6 can be arbitrarily provided; however, it is not always necessary to use it. When the dehumidifier 6 is provided, a construction similar to a refrigerating cycle shown in FIG. 12 can be applied.

The heat generated by the respective semiconductor devices 1 mounted on the board 2 is transported to the first cooling member 4 through the second cooling member 41. Since the second cooling member 41 is flexible and has a high heat conductivity, even when there is a variation in heights of the semiconductor devices mounted on the board 2, the generated heat can be efficiently transported to the first cooling member 4. As a second cooling member 41, for example, it is possible to use a member which is formed by sealing a perfluorocarbon liquid into a film which is molded in a sack shape. The generated heat transported to the first cooling member 4 is transferred to the evaporator 31 through the first cooling member. Channels are formed in the evaporator 31 connected to the first cooling member 4 and an operating refrigerant (for example, Freon) flows. When the refrigerant liquid is evaporated (at an evaporation temperature lower than a room temperature), the heat from the first cooling member 4 is received. In FIG. 1, the refrigerant liquid also flows in the evaporator 43. Fins are joined to refrigerant pipes of the evaporator 43. The air in the casing passes among the fins by the fan 42. For a period of time, the refrigerant is evaporated and the heat exchange is performed between the air and the refrigerant, so that the air is set to a low temperature. The semiconductor devices in which the cooling performance is not particularly required like the semiconductor devices mounted on the boards 16 are cooled by the forced convection of the air of a low temperature. When forced convection is unnecessary, or when all of the devices are cooled by the evaporator 31 by using the cooling members 4 and 41, the evaporator 43 and the fan 42 are unnecessary.

The refrigerant evaporated by the evaporators 31 and 43 is compressed into a high pressure by the compressor 33 and is condensed and liquefied by the condensers 32. In such a processing step, the heat is radiated to the outside of the casing. The condenser 32 is, for example, formed by directly joining a fin train to the pipes of the refrigerant. The refrigerant is again returned to the evaporator through the expansion valve 34.

As mentioned above, the heat generated heat from the semiconductor devices is efficiently transported because a heat path from the semiconductor devices to the evaporator which constructs the refrigerating cycle and is held to a low temperature is assured by the cooling members. Further, the generated heat from all of the devices are transported to the evaporator and can be totally radiated to the outside of the casing by the refrigerating cycle by using the condenser attached by using a wide area of the casing wall, so that the cooling can be performed at a very high efficiency.

In general, the operating speed of the computer differs depending on the function and the kind of device. The entire operating speed of the computer, mainly, the upper limit of the clock frequency is restricted by the lowest operating speed. On the other hand, it is known that an amount of heat generation increases as the operating speed of a certain kind of semiconductor device, for instance, a CMOS device rises or that the operating speed rises with a decrease in operating temperature. Therefore, by enhancing the cooling capability of the device, the operating speed of the device which specifies the operating speed of the entire computer is raised and the speed of the computer can be improved. In the embodiment, the semiconductor device 1 whose operating speed rises when the operating temperature is low is arranged so as to be cooled through the second cooling member 41.

When the semiconductor devices are cooled, a group of special semiconductor devices such as CMOS devices or the like can be also cooled in a lump on a board unit basis as shown in FIG. 1. In such a case, the cooling efficiency to raise the calculating speed is improved and the devices which do not need to be cooled are also protected.

Figure 2:
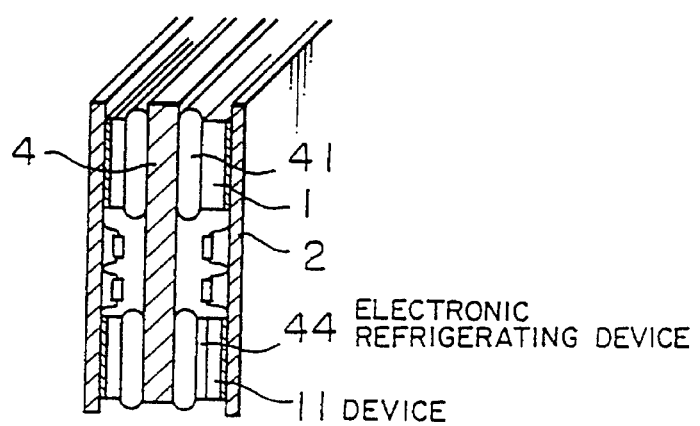

For example, as shown in FIG. 2, only special devices 1 can be also locally cooled. That is, it is possible to construct in a manner such that the first cooling member 4 is thermally come into contact with only the special devices 1 through the second cooling member 41. Particularly, an electronic refrigerating device 44 or the like using a Peltier effect can be also used with respect to devices 11 which need a high operating speed of the computer.

Although FIGS. 1 and 2 show the case where the first cooling member 4 is made of a material having a high heat conductivity, there are also considered cases where the first cooling member 4 is formed by heat pipes as shown in FIGS. 3 and 4.

As shown in FIG. 3, the first cooling member is formed by the heat pipe 4. The heat pipe 4 is formed in a flat shape. The inside of the heat pipe 4 is separated to a plurality of independent chambers 45 each of which is connected from the evaporating portion near the board 2 to the condensing portion which is in contact with the evaporator 31. Fine grooves 46 and 47 are formed on the inner wall of each chamber 45 so as to perpendicularly cross each other and to be communicated by holes at intersecting points, respectively.

For example, as shown in of FIG. 3, the grooves 46 and 47 are formed on front and back surfaces of a plate 460 in the directions which cross perpendicularly each other in a manner such that the sum of depths of the grooves which are formed on the front and back surfaces is larger than a thickness of the plate 460. Thus, holes 461 which communicate the respective grooves are formed in the intersecting portions of the grooves 46 and 47. The plate 460, formed with the grooves, metallically joins every chamber 45 to a wall 462 of the heat pipes in a region from the evaporating portion to the condensing portion. For example, water is sealed as an operating liquid into each of the chambers 45 of the heat pipes. In the evaporating portions of the heat pipes, thermally connected to the second cooling member, the operating liquid absorbs the heat from the second cooling member and is evaporated. The vapors are condensed and liquefied by the condensing portions and, at this time, the heat is transported to the evaporator 31. The liquefied operating liquid is again returned to the evaporating portion by the grooves 46. In the above case, the liquid also moves in the direction which perpendicularly crosses the grooves 46 through the grooves 47 which are communicated by the holes 461 and efficiently spreads into the whole region of the evaporating portion.

FIG. 4 shows another example in which the first cooling member is formed by a plurality of heat pipes 4. A plurality of thin-pipe shaped heat pipes 48 are bound and are inserted into a flat block made of copper or the like in the evaporating portion and the condensing portion, thereby constructing the cooling member.

After the elapse of a predetermined time after the activation of the computer, or when a set time to activate the computer is set, the refrigerator is activated before a predetermined time of such a set time. The refrigerant pressurized by the compressor 33 is cooled by the condensers 32 arranged on both sides of the casing 5. The cooled refrigerant is converged by the expansion valve 34 and becomes a liquid refrigerant of a low temperature and a low pressure. The liquid refrigerant receives the heat in the evaporators 31 and 43 and is evaporated. After that, it is returned to the compressor 33. When the first cooling member 4, thermally in contact with the evaporator 31, is made of a material of a high heat conductivity such as copper, aluminum, or the like as shown in FIGS. 1 and 2, the amount of heat which is generated by the semiconductor devices 1 is transferred to the first cooling member 4 through the second cooling member 41. The heat of the first cooling member 4 is transported to the evaporator 31 by the heat conduction and is exchanged by the evaporator 31 of a low temperature, so that the semiconductor devices 1 are cooled.

Consequently, the first cooling member 4 is held at a low temperature because it is connected to the evaporator 31 by the heat pipe(s) or the block made of copper, aluminum, or the like having a high heat conductivity. Therefore, the semiconductor device is sufficiently cooled even when any one of the device generates a large amount of heat so as to enable the computer to perform the high speed operation and it is necessary to obtain a high heat radiation amount by setting the temperature of the cooling source at a low temperature and the device such that the high speed operation can be performed by maintaining a low temperature. The reason why the first cooling member 4 contacts the semiconductor devices 1 through the second cooling member 41 having a high heat conductivity and made of a flexible material is to absorb a variation in heights of the device parts by the second cooling member 41 and to keep a small contact heat resistance. The other devices are cooled by the low temperature air by maintaining the air temperature at a low temperature by allowing the air to pass in the fin portion provided for the evaporator 43 by the fan 42 or the like. The heat transferred from the semiconductor devices to the evaporating portion is finally radiated into the external air through the condensers 32 forming a part of or all of the casing 5 by the natural convection or the forced convection air cooling by the fan or the like. The dehumidifier 6 is assembled in the casing 5 and the external air is shut out by a rubber packing or the like, thereby preventing that the semiconductor devices 1 from being conted with dew. In the embodiment, a water absorption resin is attached to the evaporating portion whose temperature decreases, the moisture contained in the air in the casing 5 is held in the water absorption resin. For example, by properly exchanging the water absorption resin at the time of maintenance or the like, the moisture in the air can be eliminated.

In the case where the heat pipe shown in FIG. 3 is used as a first cooling member, the condensed operating liquid flows along the grooves 46 and 47 and is returned to the evaporating portion. Also, by providing the grooves 46 and 47 which cross perpendicularly each other, the heat transfer area increases and the heat transfer performance in the evaporating portion can be increased. Even when the inside of the flat cooling member 4 is separated into a plurality of chambers 45, the airtightness of a certain chamber cannot be maintained and the heat transporting operation cannot be performed in such a chamber 45, the cooling functions are maintained in the other chambers 45, so that the operation as a heat pipe can be assured and the devices can be highly reliably cooled.

In the case of the first cooling member shown in FIG. 4, since the condensing portion is formed by a block, it may closely adhere and be attached by the evaporator 31 and the heat can be efficiently transferred to the evaporator 31 via the condensing portion. Even if the airtightness cannot be maintained at one portion, another heat pipe group operates, so that the heat can be transported and the high operation reliability is obtained.

As mentioned above, according to the embodiment, the operating speed can be raised by setting the operating temperature of a special device such as a CMOS device to a low temperature. For example, when an operating temperature is maintained at 0° C. or less, −50° C. or less, or −100° C. or less, it is also possible to obtain the operating speeds which are 1.5 times, 2 times, and 2.4 times as high as the operating speed at a room temperature or higher, respectively.

Thus, the operating speed of the entire computer can be remarkably improved.

Figure 5:
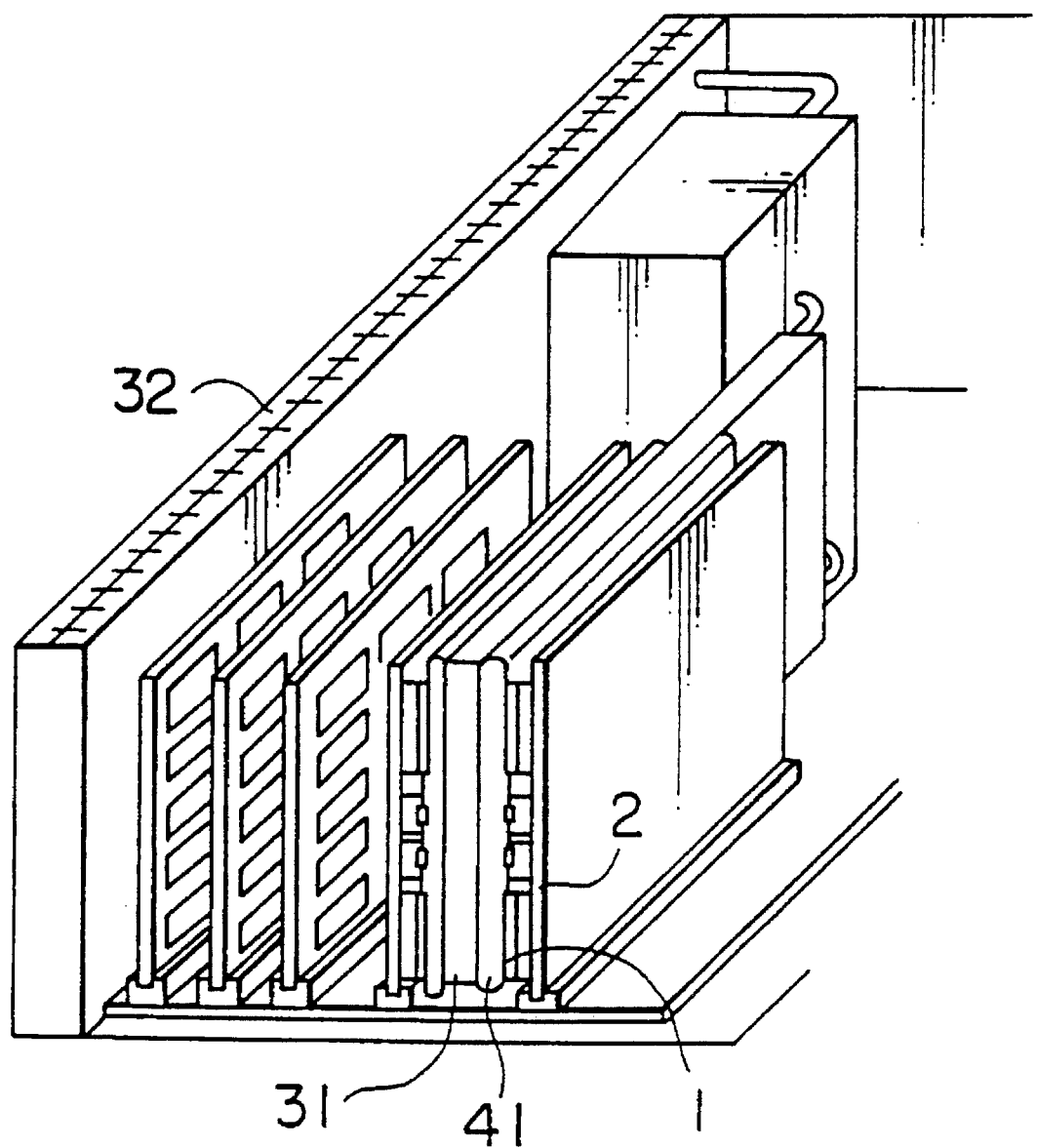
FIG. 5 is a cross sectional perspective view of a computer system showing another embodiment.

According to the embodiment shown in FIG. 5, the evaporator 31, held at a low temperature and constituting the refrigerator, is arranged near the board 2 on which the device 1 in which a high operating speed is required is mounted, and the semiconductor device 1 is thermally come into contact with the evaporator 31 by the cooling member 41 without using the second cooling member. The cooling member 41 is formed by a flexible material having a high heat conductivity in order to absorb a variation in heights of the semiconductor device parts. In the embodiment of FIG. 5, since the evaporator 31 is directly arranged near the device 1 to be cooled, the heat path from the device 1 to the cooling source is reduced, so that a high cooling performance is derived. Thus, the device 1 can be maintained at a lower temperature. Therefore, the operating speed of the device which restricts the operating speed of the entire computer is increased and the speed of the computer can be improved. The cooling member 41 can be also formed by a grease of a high heat conductivity or the like. In such a case, the high cooling performance can be obtained by a smaller heat resistance. By interposing the electronic refrigerating device between the evaporator 31 and the semcionductor device 1 and by keeping the device at a further low temperature, the high speed can be also realized.

Figure 6:
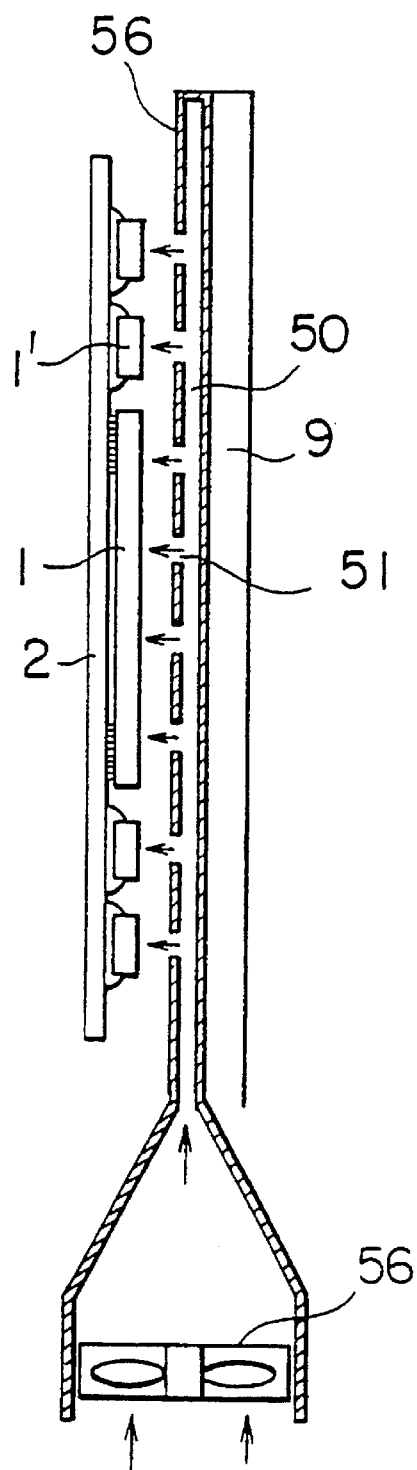
FIGS. 6 to 10 are vertical sectional views of cooling member portions showing other embodiments of the invention, respectively.

In the embodiment shown in FIG. 6, a cooling member 9 is constructed along the board 2 on which the semiconductor devices 1 are mounted. Ducts are formed between the cooling member 9 and the semiconductor devices 1, thereby forming channels 50. Holes 51 are formed at the positions corresponding to the semiconductor devices 1.

The cooling member 9 can be formed by any one of the heat pipe or block of a large heat conductivity, which is connected to the evaporator of the refrigerator provided in the casing, or the evaporator itself, and it is held at a low temperature. The air to cool introduced into channels 50 by fan 56 or like flows in parallel in the channels 50 along the cooling member 9. While the air flows in the channels 50, it is cooled by the cooling member 9 held at a low temperature. The cooled air is blown out of the holes 51 formed in the channels 50 and collides as jet air streams with the semiconductor devices 1. Generally, since the heat transfer performance at the surface of the semiconductor device in the case of using the jet air stream is very high, the semiconductor device can be effectively cooled. In such a jet stream method, since almost all of the cooling air which has passed the hole 51 directly collides with the semiconductor device 1, as compared with the case where the air flows in parallel with the board 2, the cooling air can be effectively used.

An area of the hole 51 is determined in correspondence to each of the heat generation amount of the semiconductor device 1 and each of the special devices in which a low temperature is required, respectively. By setting as mentioned above, since the semiconductor device 1 can be sufficiently cooled and the operating speed can be raised, the operating speed of the computer can be improved.

Figure 7:
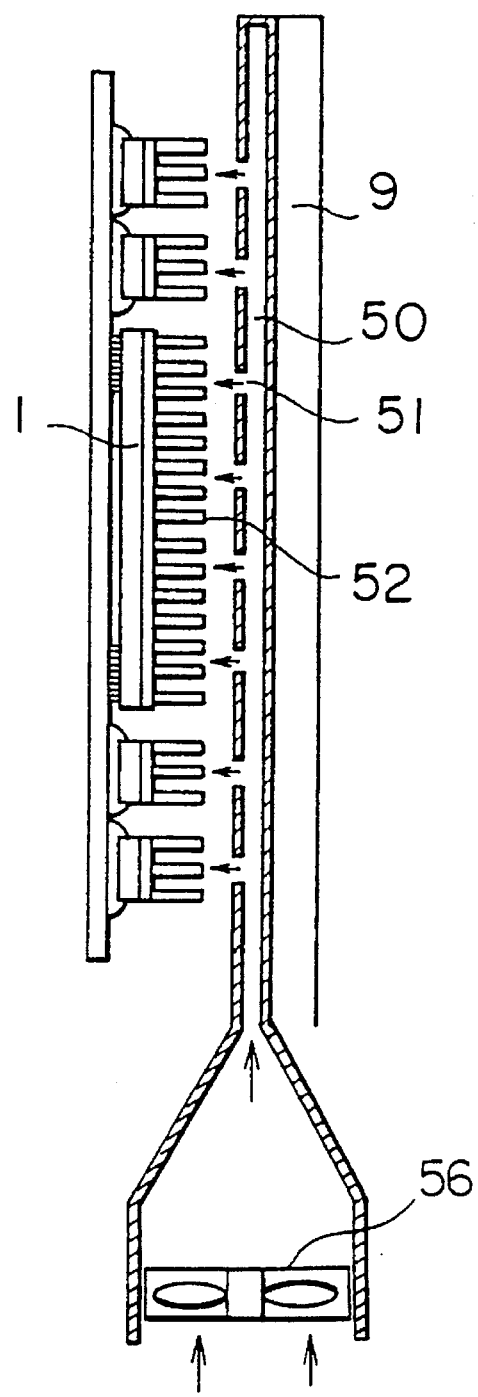

As shown in FIG. 7, a heat sink 52 can be also provided on the surface of the semiconductor device 1. Since the heat radiating area can be increased by providing the heat sink 52, the semiconductor device 1 can be more preferably cooled. Thus, the temperature of the whole semiconductor device 1 can be reduced or, in the case of the same semiconductor device temperature, a heat generation amount of the device can be increased. A speed at which the cooling air is blown out of the hole can be reduced, there is an advantage such that the noises are minimal. A shape of the heat sink 52 can be set into any one of the pin-fin shape, flat-plate shape, and the flat-plate shape may have slits. It is possible to use a shape such that the heat radiating area can be enlarged.

Figure 8:
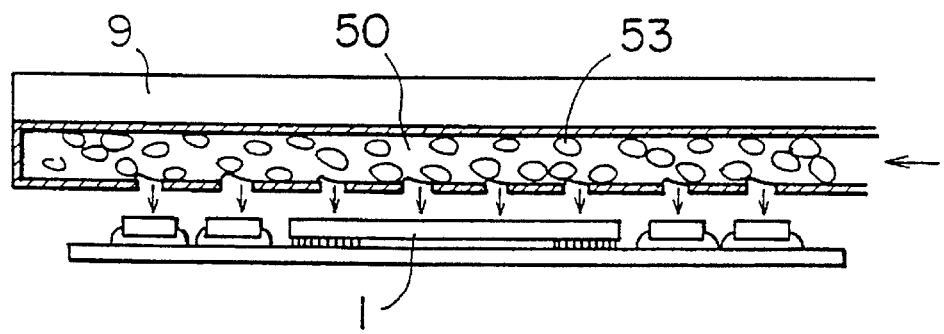
Figure 9:
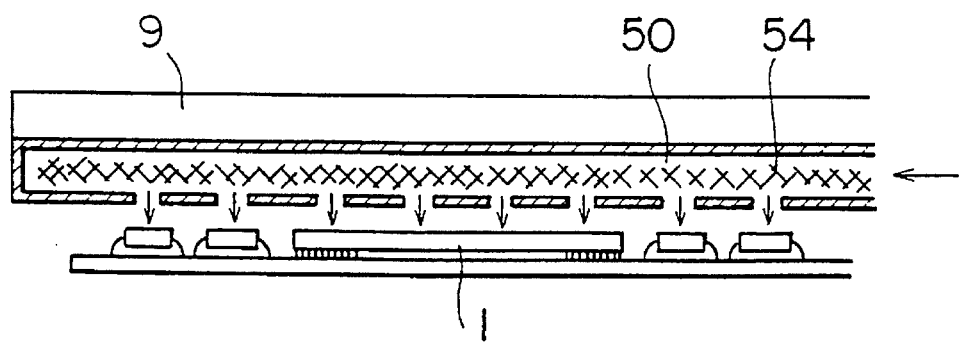
Figure 10:
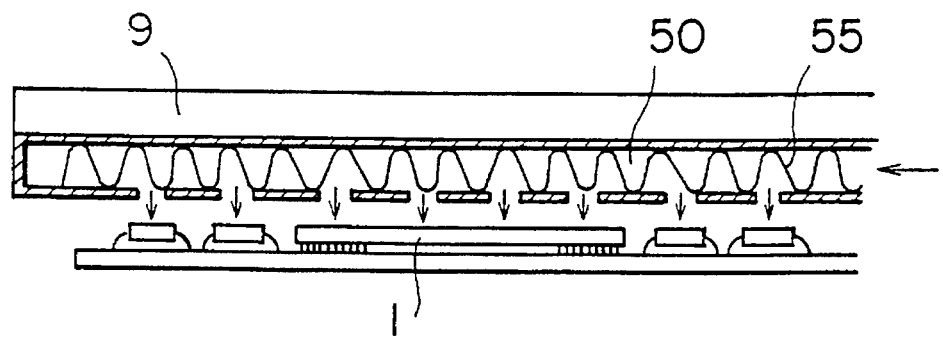

As shown in FIGS. 8, 9, and 10, one of a porous structure metal 53, thin metal wires 54, or a corrugated plate 55 formed with channels can be also inserted in the channel 50. By providing the metal body having spaces or channels in which the air flows into the channel 50, the heat exchange between the cooling air flowing in the channel 50 and the cooling member 9 held at a low temperature can be preferably executed. The semiconductor device 1 can be efficiently cooled.

Figure 11:
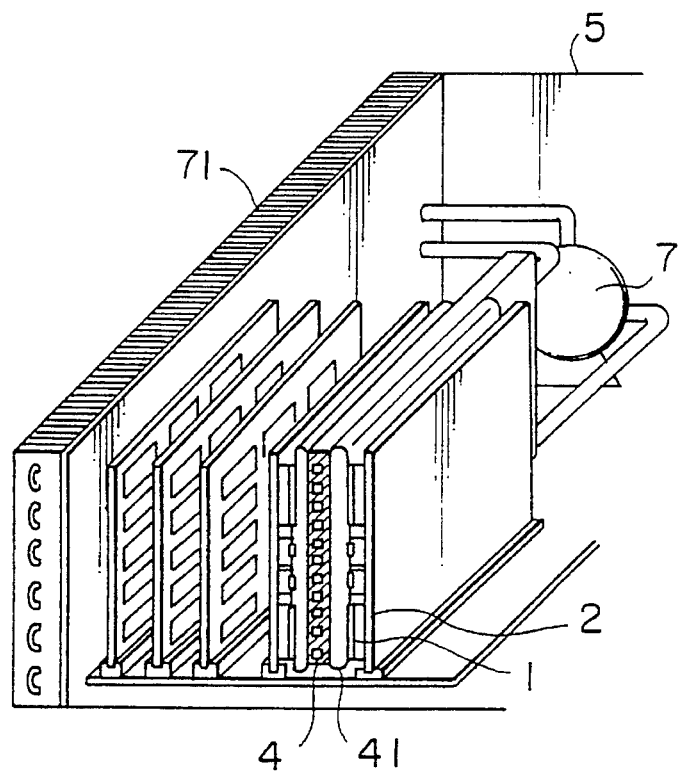
FIG. 11 is a cross sectional perspective view of an electronic computer showing another embodiment of the invention.

In the embodiment of FIG. 11, the semiconductor devices are cooled by circulating the cooling liquid by a liquid pump 7. The computer is includes the boards 2 on which a plurality of semiconductor devices 1 are mounted; the liquid pump 7; the cooling members 4 and 41 to heat transfer the cooling liquid supplied from the liquid pump 7; and a heat radiating panel 71 which is formed in a part of the casing 5 and is used to cool the cooling liquid. The semiconductor devices 1 on the board 2 are special devices in which the high speed operation can be realized by cooling. By executing the high speed operations of the special devices, the operating speed of the computer can be improved. The first cooling member 4 and the second cooling member 41 are arranged near the board 2 on which the devices 1 in which the high speed operation is needed are mounted. The semiconductor devices 1 and the first cooling member 4 are thermally connected through the second flexible cooling member 41 having a high heat conductivity. The second cooling member 41 can use a heat conductive grease or the like in order to reduce the heat path from the semiconductor device i to the first cooling member 4. On the other hand, the first and second cooling members can be also arranged for only the individual devices on the board 2. A group of liquid flowing channels are provided in the first cooling member 4. The cooling liquid (heat medium liquid) flowing in the liquid channel group cools the semiconductor devices 1. The heat medium liquid is driven by the liquid pump 7. The cooling liquid which has absorbed the heat performs the heat exchange with the external air of the casing by the heat radiating panel 71 which forms a part of the casing 5. According to the embodiment of FIG. 11, the generated heat is radiated and the device can be held at a low temperature. Therefore, the operating speed of the device which restricts the operating speed of the computer can be increased, so that the high speed operation of the computer can be realized.

Figure 12:
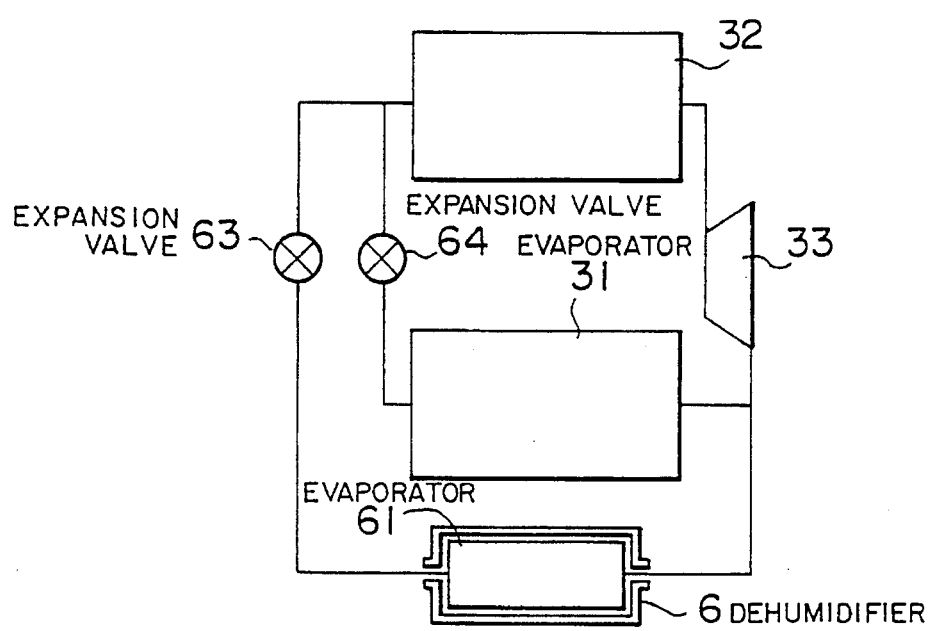
FIG. 12 is a cycle constructional diagram showing another embodiment of the invention.

Although the embodiment of FIG. 12 can be also applied to the embodiment shown in FIG. 1 or 5, it is characterized by a cycle construction in which the system operates at two or more evaporation temperatures. In the embodiment, the refrigerating cycle is constructed by two evaporators 31 and 61, two expansion valves 63 and 64, the compressor 33, and the condensers 32. The evaporator 31 has a construction similar to that of the embodiment shown in FIG. 1 or 5 and cools the semiconductor devices through the cooling member. On the other hand, the evaporator 61 is operated at an evaporating temperature lower than that of the evaporator 31 and has the dehumidifier 6. The dehumidifier 6 is provided at a ventilation port of the casing. The dehumidified air is fed into the casing. It is consequently possible to prevent that the semiconductor device which has been cooled to the low temperature is wet with dew. The dehumidifier 6 may be also constructed by, for example, a high water absorption resin or the like. It is also possible for the inside of the casing to be airtight by using a rubber packing or the like, the expansion valve 63 may have the dehumidifier 6 and the refrigerating cycle on the low temperature side may be operative only in the initial operation after the external air which has entered the casing during, for example maintenance or the like, the air in the casing is dehumidified, and thereafter, the expansion valve 64 on the high temperature side is operated, thereby cooling the semiconductor devices. Upon operation of the computer system, a humidity in the casing is detected, an opening degree of the expansion valve 63 on the low temperature side is changed as necessary, and it is possible to prevent that the formation of dew on the semiconductor device.

A computer system of the embodiment of FIGS. 13A–13C and 14 is includes the boards 2 on which a temperature detecting circuit and a clock generating circuit comprising a frequency variable oscillator are mounted and which are enclosed in the casing 5; the first cooling member 4 which is constructed by the heat pipe to cool special devices, the block having a high heat conductivity, or the like; the second cooling member 41 which is formed by a flexible member having a high heat conductivity, a structure for allowing the air to collide with the semiconductor devices, or the like; and a refrigerator 90. As shown in FIGS. 13A and 13B, the refrigerator 90 is provided as a separate unit and can be detached from the casing 5 of the computer main body. That is, in the connecting portion of the computer main body and the refrigerant unit, the first cooling member 4 of the computer main body and the evaporator 31 of the refrigerating unit are thermally physically connected by a small contact heat resistance by using an attachment structure 91. The semiconductor devices 1 are cooled through the first and second cooling members 4 and 41. When a high operating speed is not needed as a capability of the computer, the refrigerating unit is detached and the computer is operated in a state of only the computer main body or in a state in which radiating fins 92 shown in FIG. 13C are attached. At this time, the heat generated from the semiconductor devices 1 radiates into the external air by the wall surface of the first cooling member 4 or the radiating fins 92 through the first and second cooling members 4 and 41. When a high operating speed is needed, by attaching the refrigerating unit, the semiconductor devices are set into a low temperature and the high speed operation can be performed.

FIG. 14 shows the details of a reference clock generating section of the system operation in a computer in which a plurality of semiconductor devices, cooling members, and a refrigerator is enclosed in the casing and the operating speed of the whole system is raised by reducing temperatures of special semiconductor devices. The clock generating section is constructed by a frequency variable oscillator 8 whose frequency can be varied within a range from one time to two or three times in accordance with a signal from the outside and a temperature detecting circuit 80.

The temperature detecting circuit 80 detects the temperature of the semiconductor device to be cooled or the temperature of the cooling members or the evaporator of the refrigerator and supplies signals corresponding to the temperatures to the frequency variable oscillator 8 and changes the clock frequency as a reference of the system operation. The frequency can be varied by means for switching clock signals generated from a plurality of quartz oscillators having different oscillating frequencies or means for frequency dividing one frequency into a plurality of frequencies or the like. Or, it is also possible to use a ring oscillator which is constructed by a CMOS device in which a delay time of a gate linearly changes in accordance with the temperature or the like. Upon activation of the computer, since the temperature of the evaporator of the refrigerator as a cooling source does not instantaneously decrease to a predetermined level, a predetermined operating speed is not obtained in the case of the semiconductor device which is thermally in contact with the cooling source. Therefore, the temperature at this time is detected and the clock frequency is reduced. As the temperature of the evaporator decreases and the temperature of the semiconductor device decreases to a predetermined temperature, the clock frequency is raised, so that a malfunction of the system can be avoided.

By virtue of the features of the above construction, with the computer of the embodiment of FIGS. 13A–13C and 14, in the clock generating section, the temperature of the semiconductor device 1 or the cooling member 4 is detected and the clock frequency is set in accordance with the temperature. Therefore, in any cases, the computer can be operated without a malfunction at the speed corresponding to the cooling capability, namely, the temperature level of the semiconductor device without changing the device construction and circuit construction of the computer.

By directly leading the operating refrigerant of the refrigerator to the semiconductor device cooling member and by evaporating the refrigerant by the surface of the cooling member or the inside thereof as necessary, the semiconductor device cooling member is cooled, and the semicoductor device can be also cooled by using the semiconductor device cooling member as a cooling source.

On the other hand, in a computer which is constructed by wiring members such as a superconductive material or the like whose wiring resistance remarkably decreases by keeping the temperature to a low temperature, the substrate or both of the substrate and the special semiconductor devices may be also cooled to a critical temperature or lower.

As mentioned above, according to the invention, first, the temperature of the special devices which restrict the operation of the whole system can be reduced by the cooling source which is generated by the refrigerator provided in the casing or a high radiation amount is derived and the operating speed of the special device can be raised, so that the operating speed of the electronic computer can be improved.

Such special devices can be cooled at a temperature lower than room temperatures and with a highly improved cooling performance by thermally coupling the devices with a cold heat source via heat pipes or the like.

On the other hand, since the liquid can be circulated in the casing, the high cooling performance can be realized by the cooling system of a small size and low noises.

Second, since the cooling member for thermally connecting the special semiconductor device and the evaporating portion of the refrigerator is constructed by a plurality of heat pipes and the airtightness of each heat pipe is independently held, the special semiconductor device can be cooled. There is an effect such that even when the airtightness of the heat pipe of a certain portion cannot be maintained, the heat can be transported by the remaining heat pipes and the device can be cooled at a high reliability.

Third, even when the temperature of the device is maintained at a low temperature, the portion of a temperature lower than the temperatures of the semiconductor devices can be realized and the air in the casing can be dehumidified, so that a formation of dew on the semiconductor device is avoided.

Fourth, since the clock frequency of the electronic computer can be varied in accordance with the temperature of the device, the computer can also normally operate upon activation of the computer.

We claim:

1. An electronic computer with a cooling system, comprising:

means for attaching circuit devices including a plurality of semiconductor devices disposed on boards for constructing the electronic computer;

a housing for enclosing said attaching means;

cooling means including a volatile cooling fluid which can be repeatedly evaporated and condensed in said device to provide a low temperature source to cool said circuit devices; and at least one cooling member thermally connecting said low temperature source and a plurality of predetermined semiconductor devices among those disposed on said boards, circuit operating speeds of said predetermined semiconductor devices rising due to temperature drop thereof, said cooling member having at least one surface portion in contact with a plurality of said predetermined semiconductor devices on a board, which devices have possible various heights, said at least one surface portion which contacts said plurality of predetermined semiconductor devices being composed of a flexible member for flexibly contacting with the various heights of said plurality of predetermined semiconductor devices and having a high heat conductivity whereby heat can be efficiently transported to said low temperature source from said plurality of predetermined semiconductor devices even where there is a variation in heights of said plurality of predetermined semiconductor devices.

2. The electronic computer with a cooling system according to claim 1, wherein said cooling means comprises: a liquid pump to circulate said cooling liquid serving as said low temperature source; a first cooling member to heat transfer the cooling liquid supplied from said liquid pump; and a radiating panel to cool the cooling liquid, and wherein said predetermined semiconductor devices and said first cooling member are thermally connected through a second cooling member as said cooling member having at least one surface portion composed of a flexible member.

3. The electronic computer with a cooling system according to claim 1, further comprising a temperature detecting circuit for detecting temperature of a predetermined one of said predetermined semiconductor devices, said cooling member coupled thereto and said low temperature source; and further comprising a variable frequency oscillator with means for changing an oscillation frequency of said oscillator on the basis of the temperature detected by said temperature detecting circuit and supplying a reference clock signal of the changed frequency for said computer.

4. The electronic computer with a cooling system according to claim 1, comprising another housing for enclosing said cooling means so as to be detachably coupled to said housing enclosing the cooling member therein.

5. The electronic computer with a cooling system according to claim 1, comprising a first cooling member which is thermally connected to the predetermined semiconductor devices through a second cooling member as said cooling member having at least one surface portion composed of a flexible member, and wherein said cooling means comprises a refrigerating apparatus including an evaporator, and the first cooling member and the evaporator are constructed by an attachment structure, and the refrigerating apparatus and the computer can be detached.

6. The electronic computer with a cooling system according to claim 1, wherein the cooling member is constructed by heat pipes and is separated into a plurality of chambers each having airtightness.

7. The electronic computer with a cooling system according to claim 1, wherein the cooling member is constructed by a bundle of a plurality of heat pipes, and an evaporating portion and a condensing portion of said heat pipes are constructed in a block shape.

8. The electronic computer with a cooling system according to claim 1, wherein a water absorption resin is arranged near the evaporator.

9. The electronic computer with a cooling system according to claim 1, wherein the temperatures of said predetermined semiconductor devices are held to at least 0° C. or lower and the operating speeds of said predetermined semiconductor devices are improved to an operating speed which is 1.5 or more times as high as the operating speed at a room temperature.

10. The electronic computer with a cooling system according to claim 1, wherein the temperatures of said predetermined semiconductor devices are held to at least −50° C. or lower and the operating speeds of said predetermined semiconductor devices are improved to an operating speed which is two or more times as high as the operating speed at a room temperature.

11. The electronic computer with a cooling system according to claim 1, wherein the temperatures of said predetermined semiconductor devices are held to at least −100° C. or lower and the operating speeds of said predetermined semiconductor devices are improved to the operating speed which is 2.4 or more times as high as the operating speed at a room temperature.

12. The electronic computer with a cooling system according to claim 1, wherein an electronic refrigerating device is interposed between said predetermined semiconductor devices and said cooling member.

13. An electronic computer with a cooling system according to claim 1, wherein said cooling means includes a refrigerator comprising a compressor, an evaporator, a condenser and an expansion valve for circulating therethrough said volatile cooling liquid as an operating refrigerant; and wherein said housing envelops said condenser and said at least one cooling member with at least a portion of said housing being formed by said condenser.

14. The electronic computer with a cooling system according to claim 13, wherein said refrigerator has a second evaporator which is set into an evaporation temperature lower than that of an evaporator of said cooling means, and a moisture is dehumidified by the second evaporator.

15. The electronic computer with a cooling system according to claim 13, wherein a humidity in said housing of said computer is detected and an opening degree of the expansion valve on the low temperature side of the refrigerator is changed in accordance with the detected humidity.

16. An electronic computer with a cooling system according to claim 13, wherein said evaporator or ducts formed in said cooling member coupled to said evaporator are disposed near said predetermined semiconductor devices; and said ducts are formed with holes adapted to blow out cooled air therethrough to said predetermined semiconductor devices.

17. An electronic computer with a cooling system comprising a combination of a computer including a plurality of semiconductor devices disposed on a wired board and a cooling apparatus for cooling said semiconductor devices, said cooling apparatus including a refrigerating apparatus;

said plurality of semiconductor devices including a first type of semiconductor devices whose operation speed increases with a decrease in temperature thereof, and another type of semiconductor devices;

means for locally cooling to cool said first type of semiconductor devices to a temperature lower than temperatures of said another type of semiconductor devices;

said means for locally cooling including at least one cooling member for thermally connecting a plurality of said first type of semiconductor devices and an evaporator of said refrigerating apparatus, said cooling member having at least one surface portion in contact with said plurality of said first type of semiconductor devices, said at least one surface portion which contacts said plurality of said first type of semiconductor devices being composed of a flexible member having a high heat conductivity whereby heat can be efficiently transported to said evaporator from said plurality of first type of semiconductor devices even where there is a variation in heights of respective ones of said plurality of said first type of semiconductor devices.

18. The electronic computer with a cooling system according to claim 17, wherein said means for locally cooling comprises a first cooling member and a second flexible cooling member as said cooling member having a high heat conductivity and at least one surface portion composed of a flexible member, said second flexible cooling member being arranged between the first cooling member and said first type of semiconductor devices.

* * * * *